(12) United States Patent
Alexander

(10) Patent No.: US 9,799,731 B2
(45) Date of Patent: Oct. 24, 2017

(54) MULTI-LEVEL INVERTERS USING SEQUENCED DRIVE OF DOUBLE-BASE BIDIRECTIONAL BIPOLAR TRANSISTORS

(71) Applicant: Ideal Power Inc., Austin, TX (US)

(72) Inventor: William C. Alexander, Spicewood, TX (US)

(73) Assignee: Ideal Power, Inc., Austin, TX (US)

( * ) Notice: Subject to any disclaimer, the term of this patent is extended or adjusted under 35 U.S.C. 154(b) by 0 days.

(21) Appl. No.: 15/004,872

(22) Filed: Jan. 22, 2016

(65) Prior Publication Data

US 2016/0285388 A1 Sep. 29, 2016

Related U.S. Application Data

(63) Continuation-in-part of application No. 14/792,262, filed on Jul. 6, 2015, now Pat. No. 9,356,595, which
(Continued)

(51) Int. Cl.
*H01L 29/747* (2006.01)
*H01L 29/10* (2006.01)
(Continued)

(52) U.S. Cl.
CPC ...... *H01L 29/1004* (2013.01); *H01L 29/0619* (2013.01); *H01L 29/0804* (2013.01);
(Continued)

(58) Field of Classification Search
CPC ... H01L 29/1004; H01L 29/747; H01L 29/73; H01L 29/16; H01L 29/0619;
(Continued)

(56) References Cited

U.S. PATENT DOCUMENTS 3,476,993 A 11/1969 Aldrich et al.
3,996,601 A 12/1976 Hutson
(Continued)

FOREIGN PATENT DOCUMENTS

DE 2231777 A1 3/1973
DE 4011509 A1 10/1990
(Continued)

OTHER PUBLICATIONS

Alepuz et al, "Interfacing Renewable Energy Sources to the Utility Grid Using a Three-Level Inverter", "IEEE Transactions on Industrial Electronics", , pp. 1504-1511, vol. 53, No. 5, Publisher: IEEE.
(Continued)

*Primary Examiner* — William F Kraig
*Assistant Examiner* — Pavel Ivanov
(74) *Attorney, Agent, or Firm* — Groover & Associates PLLC; Robert O. Groover, III; Gwendolyn G. Corcoran

(57) ABSTRACT

Power is inverted using double-base-contact bidirectional bipolar transistors in a three-level-inverter topology. The transistors not only switch to synthesize a PWM approximation of the desired AC waveform, but also have transient phases of diode conduction before each full turn-on or turn-off.

16 Claims, 7 Drawing Sheets

Related U.S. Application Data is a continuation of application No. 14/735,782, filed on Jun. 10, 2015, now Pat. No. 9,190,894, which is a continuation of application No. 14/514,988, filed on Oct. 15, 2014, now Pat. No. 9,059,710, which is a continuation of application No. 14/313,960, filed on Jun. 24, 2014, now Pat. No. 9,029,909, application No. 15/004,872, which is a continuation-in-part of application No. 14/992,971, filed on Jan. 11, 2016.

(60) Provisional application No. 62/107,250, filed on Jan. 23, 2015, provisional application No. 61/838,578, filed on Jun. 24, 2013, provisional application No. 61/841,624, filed on Jul. 1, 2013, provisional application No. 61/914,491, filed on Dec. 11, 2013, provisional application No. 61/914,538, filed on Dec. 11, 2013, provisional application No. 61/924,884, filed on Jan. 8, 2014, provisional application No. 61/925,311, filed on Jan. 9, 2014, provisional application No. 61/928,133, filed on Jan. 16, 2014, provisional application No. 61/928,644, filed on Jan. 17, 2014, provisional application No. 61/929,731, filed on Jan. 21, 2014, provisional application No. 61/929,874, filed on Jan. 21, 2014, provisional application No. 61/933,442, filed on Jan. 30, 2014, provisional application No. 62/007,004, filed on Jun. 3, 2014, provisional application No. 62/008,275, filed on Jun. 5, 2014, provisional application No. 62/101,498, filed on Jan. 9, 2015.

(51) Int. Cl.

| | | |
|---|---|---|
| *H01L 29/417* | (2006.01) | |
| *H01L 29/423* | (2006.01) | |
| *H01L 29/73* | (2006.01) | |
| *H01L 29/732* | (2006.01) | |
| *H01L 29/737* | (2006.01) | |
| *H01L 29/739* | (2006.01) | |
| *H01L 29/06* | (2006.01) | |
| *H01L 29/08* | (2006.01) | |
| *H01L 29/16* | (2006.01) | |
| *H02M 3/158* | (2006.01) | |
| *H03K 17/60* | (2006.01) | |
| *H03K 17/66* | (2006.01) | |
| *H02M 7/487* | (2007.01) | |

(52) U.S. Cl.
CPC ...... *H01L 29/0817* (2013.01); *H01L 29/0821* (2013.01); *H01L 29/16* (2013.01); *H01L 29/1604* (2013.01); *H01L 29/41708* (2013.01); *H01L 29/42304* (2013.01); *H01L 29/73* (2013.01); *H01L 29/732* (2013.01); *H01L 29/7375* (2013.01); *H01L 29/7393* (2013.01); *H01L 29/7395* (2013.01); *H01L 29/747* (2013.01); *H02M 3/1582* (2013.01); *H02M 7/487* (2013.01); *H03K 17/60* (2013.01); *H03K 17/66* (2013.01)

(58) Field of Classification Search
CPC ............. H01L 29/0804; H01L 29/1604; H01L 29/7375; H01L 29/42304; H01L 29/7395; H01L 29/0817; H01L 29/732; H01L 29/7393; H01L 29/0821; H01L 29/41708; H02M 7/487; H02M 3/1582; H03K 17/60; H03K 17/66

See application file for complete search history.

(56) References Cited

U.S. PATENT DOCUMENTS

| | | |
|---|---|---|
| 4,131,902 A | 12/1978 | Kub |
| 4,816,892 A | 3/1989 | Temple |
| 4,980,743 A | 12/1990 | Nakagawa et al. |
| 5,040,042 A | 8/1991 | Bauer et al. |
| 5,608,237 A | 3/1997 | Aizawa |
| 5,793,064 A | 8/1998 | Li |
| 5,852,559 A | 12/1998 | Li |
| 5,910,664 A | 6/1999 | Ajit |
| 6,313,488 B1 | 11/2001 | Bakowski et al. |
| 6,838,925 B1 | 1/2005 | Nielsen |
| 7,599,196 B2* | 10/2009 | Alexander .......... H02M 3/1582 363/124 |
| 7,728,367 B2 | 6/2010 | Bui |
| 8,462,524 B2 | 6/2013 | Gekeler |
| 8,796,750 B2 | 8/2014 | Bui |
| 2002/0060330 A1 | 5/2002 | Onishi et al. |
| 2003/0042537 A1 | 3/2003 | Nakamura et al. |
| 2003/0057480 A1 | 3/2003 | Mathieu |
| 2004/0070027 A1 | 4/2004 | Nielson et al. |
| 2005/0090107 A1 | 4/2005 | Draney |
| 2005/0245006 A1 | 11/2005 | Tseng |
| 2005/0258493 A1 | 11/2005 | Aono |
| 2006/0118818 A1 | 6/2006 | Shimoida et al. |
| 2006/0249752 A1 | 11/2006 | Asano |
| 2006/0261346 A1 | 11/2006 | Ryu et al. |
| 2008/0191238 A1 | 8/2008 | Madathil et al. |
| 2009/0058500 A1 | 3/2009 | Osawa et al. |
| 2010/0327355 A1 | 12/2010 | Yuan et al. |
| 2011/0116293 A1* | 5/2011 | Tabata .................. H02M 7/487 363/132 |
| 2011/0121407 A1 | 5/2011 | Quoirin et al. |
| 2012/0014151 A1* | 1/2012 | Alexander ............ H02M 5/225 363/123 |
| 2012/0175729 A1 | 7/2012 | Bowman |
| 2014/0111892 A1 | 4/2014 | Chen et al. |
| 2014/0233290 A1* | 8/2014 | Spanos ............... H02M 7/5387 363/131 |
| 2014/0240027 A1 | 8/2014 | Blanchard et al. |
| 2014/0339600 A1 | 11/2014 | Yoshikawa |
| 2014/0375287 A1* | 12/2014 | Blanchard .......... H01L 29/0817 323/271 |
| 2014/0376291 A1* | 12/2014 | Blanchard .......... H01L 29/0817 363/123 |

FOREIGN PATENT DOCUMENTS

| | | |
|---|---|---|
| DE | 4014207 A1 | 12/1990 |
| DE | 102004005384 A1 | 8/2005 |
| DE | 102005047101 B3 | 1/2007 |
| EP | 0111804 B1 | 9/1987 |
| EP | 0438700 A1 | 7/1991 |
| EP | 2325890 | 5/2011 |
| GB | 1513000 A | 6/1978 |
| GB | 2380604 B2 | 2/2005 |
| GB | 2510716 A1 | 8/2014 |
| JP | S58218169 A | 12/1983 |
| JP | H01146366 A2 | 6/1989 |
| JP | H03147378 A | 6/1991 |
| JP | 2004342718 A2 | 12/2004 |
| JP | 2008205512 A2 | 9/2008 |
| JP | 2009141270 A2 | 6/2009 |
| JP | 2009295684 A2 | 12/2009 |
| WO | 2011008567 | 1/2011 |
| WO | 2014122472 A1 | 8/2014 |

OTHER PUBLICATIONS

Ed. P. Martin, "Applikationshandbuch IGBT- und MOSFET-Leistungsmodule", 1998, Page(s) Section 1.2.3 Qualitatives Schaltverhalten von MOSFET und IGBT beim harten Schalten, Publisher: Isle, Ilmenau.

A. Bourennane et al., "High temperature wafer bonding technique for the realization of a voltage and current bidirectional IGBT",

(56) References Cited

OTHER PUBLICATIONS

"Power Semiconductor Devices and ICs (ISPSD), 2011 IEEE 23rd International Symposium on", May 26, 2011, pp. 120-123, Publisher: IEEE.

Jean-Christophe Crebier, "Integration monolithique et composants de puissance", "Institut National Polytechnique de Grenoble—INPG", Jul. 17, 2006.

Erdman et al., "A 2.3-MW Medium-Voltage, Three-Level Wind Energy Inverter Applying a Unique Bus Structure and 4.5-kV Si/SiC Hybrid Isolated Power Modules", "2015 IEEE Applied Power Electronics Conference and Exposition (APEC)", May 11, 2015, pp. 1282-1289, Publisher: IEEE.

"European Search Report in related EP Application No. 14816902.2 (published as EP2901483), dated Sep. 14, 2015", Sep. 14, 2015, Publisher: European Patent Office.

Gekeler, "Soft switching three level inverter with passive snubber circuit (S3L inverter)", "Power Electronics and Applications (EPE 2011), Proceedings of the 2011—14th European Conference on", Sep. 15, 2011, pp. 1-10, Publisher: IEEE, Published in: Birmingham.

Gekeler, "Welch schaltender 3-Stufen-Pulswechselrichter mit verlusffreiem Entlastungsnetzwerk", "International ETG Congress 2011 (ETG Technical Report 130 Part B)", Nov. 9, 2011, pp. 264270, Publisher: VDE Verlag GmbH, Published in: Wurzburg, Germany.

Der-Feng Guo et al., "Investigation of Amplifying and Switching Characteristics in Double Heterostructure-Emitter Bipolar Transistors", "Journal of the Electrochemical Society", Jan. 1, 2007, p. H283, vol. 154, No. 4.

K.D. Hobart et al., "Characterization of a Bi-Directional Double-Side Double-Gate IGBT Fabricated by Wafer Bonding", "Power Semiconductor Devices and ICs, 2001, Proceedings of the 13th International Symposium on", Jun. 7, 2001, pp. 125-128, Publisher: ISPSD '01.

Ideal Power Inc., "B-Tran—Bi-Directional Bi-Polar Junction TRANsistor", Aug. 20, 2015, Published in: US.

Ngwendson Luther-King et al., "MOS Control Device Concepts for AC-AC Matrix Converter Applications: The HCD Concept for High-Efficiency Anode-Gated Devices", "IEEE Transactions on Electron Devices", Sep. 9, 2005, pp. 2075-2080, vol. 52, No. 9, Publisher: IEEE.

Nabae, et al., "A New Neutral-Point-Clamped PWM Inverter", "IEEE Transactions on Industry Applications", Sep. 1981, pp. 518-523, vol. IA-17, No. 5, Publisher: IEEE.

Binh-Dac Nguyen et al., "AC switches with integrated gate driver supplies", "Power Electronics and Applications, 2005 European Conference on", Sep. 14, 2005, pp. 1-9, Publisher: IEEE, Published in: Dresden, Germany.

Ronald Yutaka Nishi, "Theory of Conductivity Modulation in Semiconductors", Jun. 1, 1962, Publisher: University of British Columbia.

Luong Viet Phung et al., "Modeling of a New SOI Bidirectional Bipolar Junction Transistor for Low-Loss Household Appliances", "Electron Devices, IEEE Transactions on", Mar. 22, 2011, pp. 1164-1169, vol. 58, No. 4, Publisher: IEEE.

Luong Viet Phung et al., "Modelling of a symmetrical bipolar monolithic bidirectional switch", "Power Electronics and Applications, 2009. EPE '09. 13th European Conference on", Sep. 10, 2009, pp. 1-9, Publisher: IEEE, Published in: Barcelona, Spain.

Powerex, "Three Level Inverter Application Note", "http://www.pwrx.com/pwrx/app/TLI%20Series%20Application%20Note.pdf, retrieved Jan. 23, 2015", Jun. 1, 2009, Publisher: PowerEx.

Schweizer et al., "High efficiency drive system with 3-level T-type inverter", "ower Electronics and Applications (EPE 2011), Proceedings of the 2011—14th European Conference on", Sep. 15, 2011, pp. 1-10, Publisher: IEEE.

J.-W. Wu et al., "Low-temperature hydrophobic wafer bonding for 1200V, 25A bi-directional Si UMOS IGBTs", "Lester Eastman Conference on High Performance Devices (LEC)", Aug. 7, 2014, pp. 1-4.

Shanqi Zhao et al., "Design, fabrication and characterization of a bi-directional insulated gate bipolar transistor", "Solid-State and Integrated Circuits Technology", Oct. 21, 2004, vol. 1, Publisher: Solid-State and Integrated Circuits Technology.

\* cited by examiner

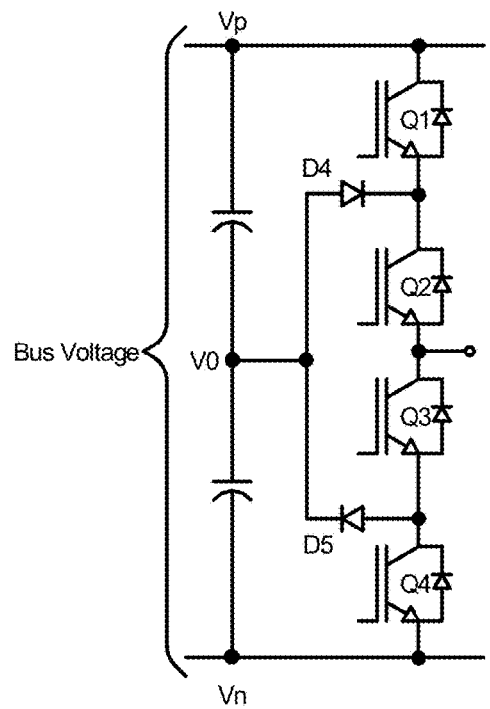
Prior Art
FIG. 2C
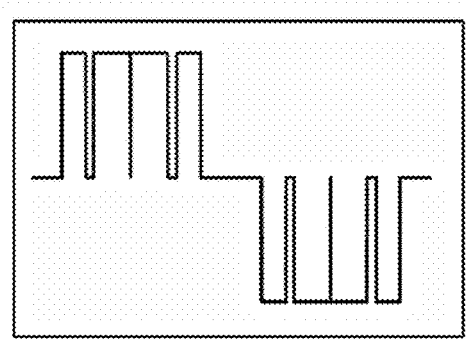      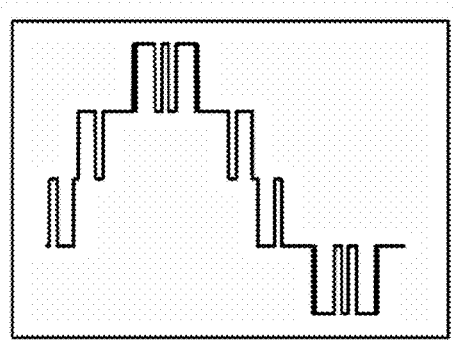
Prior Art
FIG. 2D
Prior Art
FIG. 2E

MULTI-LEVEL INVERTERS USING SEQUENCED DRIVE OF DOUBLE-BASE BIDIRECTIONAL BIPOLAR TRANSISTORS

CROSS-REFERENCE

Priority is claimed from U.S. application 62/107,250 filed Jan. 23, 2015, which is hereby incorporated by reference. Priority is also claimed from U.S. application Ser. No. 14/992,971, and therethrough from U.S. application 62/101, 498 filed Jan. 9, 2015, both of which are hereby incorporated by reference. Priority is also claimed from U.S. application Ser. No. 14/792,262, and therethrough from U.S. application Ser. No. 14/735,782, and therethrough from U.S. application Ser. No. 14/514,988, and therethrough from U.S. application Ser. No. 14/313,960, and therethrough from U.S. applications 61/838,578 filed Jun. 24, 2013; 61/841,624 filed Jul. 1, 2013; 61/914,491 filed Dec. 11, 2013; 61/914,538 filed Dec. 11, 2013; 61/924,884 filed Jan. 8, 2014; 61/925,311 filed Jan. 9, 2014; 61/928,133 filed Jan. 16, 2014; 61/928,644 filed Jan. 17, 2014; 61/929,731 filed Jan. 21, 2014; 61/929,874 filed Jan. 21, 2014; 61/933,442 filed Jan. 30, 2014; 62/007,004 filed Jun. 3, 2014; and 62/008,275 filed Jun. 5, 2014, each and every one of which is hereby incorporated by reference.

BACKGROUND

The present application relates to multilevel power inverters, and more particularly to medium-voltage and line-voltage three-level power inverters.

Note that the points discussed below may reflect the hindsight gained from the disclosed inventions, and are not necessarily admitted to be prior art. In particular, note that the following discussion also recapitulates many teachings found in the parent applications.

Parent application US 2014-0375287 (which is hereby incorporated by reference) disclosed a fully bidirectional bipolar transistor with two base terminals. Such transistors are referred to as "B-TRANs." The base region of the transistor is preferably the bulk of a semiconductor die. The transistor preferably has two emitter/collector regions, one on each face of the die. Two distinct base contact regions are also provided—one on each face of the die. Thus, for example, with a p-type semiconductor die, each face would include an n+ emitter/collector region and a p-type base contact region. Isolation trenches and peripheral field-limiting rings are preferably also included, but in essence the B-TRAN is a four-terminal three-layer device.

An example of a B-TRAN structure is generally illustrated in FIG. 4. In this Figure, both faces of a semiconductor die carry emitter/collector regions which form a junction with the bulk substrate. Base contact regions are also present on both faces. This example shows an npn structure, so the emitter/collector regions are n-type, and the base contact regions are p-type. A shallow n+ contact doping provides ohmic contact from the separate emitter/collector terminals (on the two opposite faces of the semiconductor die, in this example) to the emitter/collector regions, and a shallow p+ contact doping provides ohmic contact from the separate base terminals (on the two opposite faces of the die) to the base contact regions. In this example, the dielectric-filled trenches provide lateral separation between the base contact regions and the emitter/collector regions. However, each trench can also include a conducting region, such as doped polysilicon, that is surrounded by a dielectric, and is electrically connected to the emitter/collector to form a vertical field plate, increasing breakdown voltage. (Note that a p-type diffused region may be added to reduce the series resistance between the emitter-to-base junction and the base contact.) B-TRANs can provide significantly better efficiency than is conventionally available for existing static transfer switches; for example, a 1200V B-TRAN has an expected system efficiency of 99.9%.

Parent application US 2014-0375287 also describes some surprising aspects of operation of this kind of device. Notably: 1) when the device is turned on, it is preferably first operated merely as a diode, and base drive is then applied to reduce the on-state voltage drop. 2) Base drive is preferably applied to the base nearest whichever emitter/collector region will be acting as the collector (as determined by the external voltage seen at the device terminals). This operation is very different from typical bipolar transistor operation, where the base contact is (typically) closely connected to the emitter-base junction but may be far from the collector contact. 3) A two-stage turnoff sequence is preferably used. In the first stage of turnoff, the transistor is brought out of full bipolar conduction, but still is connected to operate as a diode; in the final state of turnoff diode conduction is blocked too. 4) In the off state, base-emitter voltage (on each side) is limited by an external low-voltage diode which parallels that base-emitter junction. This prevents either of the base-emitter junctions from getting anywhere close to forward bias, and avoids the degradation of breakdown voltage which can occur otherwise.

Since the B-TRAN is a fully symmetric device, there is no difference between the two emitter/collector regions. However, in describing the operation of the device, the externally applied voltage will determine which side is (instantaneously) acting as the emitter, and which is acting as the collector. The two base contact terminals are accordingly referred as the "e-base" and "c-base", where the c-base terminal is on the side of the device which happens to be the collector side at a given moment.

FIG. 3A shows a sample equivalent circuit for one exemplary NPN B-TRAN. Body diodes 312A and 312B can correspond to e.g. the upper and lower P-N junctions, respectively. Switches 314A and 314B can short respective base terminals 108A and 108B to respective emitter/collector terminals 106A and 106B.

In one sample embodiment, a B-TRAN can have six phases of operation in each direction, as follows:

1) Initially, as seen in FIG. 3B, voltage on emitter/collector terminal T1 is positive with respect to emitter/collector terminal T2. Switches 314A and 316A are open, leaving base terminal B1 open. Switch 314B is closed, shorting base terminal B2 to emitter/collector terminal T2. This, in turn, functionally bypasses body diode 312B. In this state, the device is turned off. No current will flow in this state, due to the reverse-biased P-N junction (represented by body diode 312A) at the upper side of the device.

2) As seen in FIG. 3C, the voltage on emitter/collector terminal T1 is brought negative with respect to emitter/collector terminal T2. P-N diode junction 312A is now forward biased, and now begins injecting electrons into the drift region. Current flows as for a forward-biased diode.

After a short time, e.g. a few microseconds, the drift layer is well-charged. The forward voltage drop is low, but greater in magnitude than 0.7 V (a typical silicon diode voltage drop). In one sample embodiment, a typical forward voltage drop (Vf) at a typical current density of e.g. 200 A/cm$^2$ can have a magnitude of e.g. 1.0 V.

3) To further reduce forward voltage drop Vf, the conductivity of the drift region is increased, as in e.g. FIG. 3D.

To inject more charge carriers (here, holes) into the drift region, thereby increasing its conductivity and decreasing forward voltage drop Vf, base terminal B2 is disconnected from terminal T2 by opening switch 314B. Base terminal B2 is then connected to a source of positive charge by switch 316B. In one sample embodiment, the source of positive charge can be, e.g., a capacitor charged to +1.5 VDC. As a result, a surge current will flow into the drift region, thus injecting holes. This will in turn cause upper P-N diode junction 312A to inject even more electrons into the drift region. This significantly increases the conductivity of the drift region and decreases forward voltage drop Vf to e.g. 0.1-0.2 V, placing the device into saturation.

4) Continuing in the sample embodiment of FIG. 3D, current continuously flows into the drift region through base terminal B2 to maintain a low forward voltage drop Vf. The necessary current magnitude is determined by, e.g., the gain of equivalent NPN transistor 318. As the device is being driven in a high level injection regime, this gain is determined by high level recombination factors such as e.g. surface recombination velocity, rather than by low-level-regime factors such as thickness of, and carrier lifetime within, the base/drift region.

5) To turn the device off, as in e.g. FIG. 3E, base terminal B2 is disconnected from the positive power supply and connected instead to emitter terminal T2, opening switch 316B and closing switch 314B. This causes a large current to flow out of the drift region, which in turn rapidly takes the device out of saturation. Closing switch 314A connects base terminal B1 to collector terminal T1, stopping electron injection at upper P-N junction 312A. Both of these actions rapidly remove charge carriers from the drift region while only slightly increasing forward voltage drop Vf. As both base terminals are shorted to the respective emitter/collector terminals by switches 314A and 314B, body diodes 312A and 312B are both functionally bypassed.

6) Finally, at an optimum time (which can be e.g. nominally 2 μs for a 1200 V device), full turn-off can occur, as seen in e.g. FIG. 3F. Full turn-off can begin by opening switch 314B, disconnecting base terminal B2 from corresponding terminal T2. This causes a depletion region to form from lower P-N diode junction 312B as it goes into reverse bias. Any remaining charge carriers recombine, or are collected at the upper base. The device stops conducting and blocks forward voltage.

The procedure of steps 1-6 can, when modified appropriately, used to operate the device in the opposite direction. Steps 1-6 can also be modified to operate a PNP B-TRAN (e.g. by inverting all relevant polarities).

Note that, even though the B-TRAN is a four-terminal device, with two base contact regions which are operated separately, its device physics are those of a three-layer device—i.e. it only has one base region. That is the center of the die's vertical extent, between the two emitter junctions. Since the B-TRAN is a symmetrically bipolar device, only one of the two emitter/collector regions will be operating as an emitter at any given moment; but the bottom junction of either emitter/collector region is referred to here, for convenience, as an "emitter junction."

A somewhat similar structure was shown and described in application WO2014/122472 of Wood. However, that application is primarily directed to different structures. The Wood application also does not describe the methods of operation described in the US 2014-0375287 application.

"Inverter" is the general term for a circuit which converts DC to AC. In power electronics, inverters are often used to convert DC power from batteries or solar banks for use. A typical power inverter device or circuit requires a relatively stable DC power source capable of supplying enough current for the intended power demands of the system. The input voltage depends on the design and purpose of the inverter. Examples include:

12 VDC, for smaller consumer and commercial inverters that typically run from a rechargeable 12 V lead acid battery.

24 and 48 VDC, which are common standards for home energy systems.

200 to 400 VDC, when power is from photovoltaic solar panels.

300 to 450 VDC, when power is from electric vehicle battery packs in vehicle-to-grid systems.

Hundreds of thousands of volts, where the inverter is part of a high voltage direct current power transmission system.

One particular type of power inverter is the three level inverter, where each output line can be connected to one of three voltage levels. (When the power source is a two-voltage DC supply, a "neutral" voltage leg can be generated by capacitors, as shown in FIG. 2A.) Three level inverters offer several advantages over the more common two level inverter. As compared to two level inverters, three level inverters have smaller output voltage steps that mitigate motor issues due to long power cables between the inverter and the motor. These issues can include, for example, motor shaft bearing currents, and excessive voltage rates. In addition, the cleaner output waveform provides an effective switching frequency twice that of the actual switching frequency. Should an output filter be required, the components will be smaller and less costly than for an equivalent rated two level inverter. Most often the three-level inverter has been used for higher voltages. Because the IGBTs are only subjected to half of the bus voltage, lower voltage switches can be used.

FIG. 2A shows a conventional three-phase three-level inverter using four IGBTs plus two diodes on each phase leg. Outputs include U, V, and W phases, which can be connected for motor drive.

FIG. 2B shows a conventional soft-switched three-level inverter, with the snubber circuit highlighted.

FIG. 2C shows one phase leg of the inverter of FIG. 2A. IGBTs Q1 and Q2 are activated to connect to positive voltage Vp; Q2 and Q3 are activated to connect to intermediate voltage Vo; and Q3 and Q4 are activated to connect to negative voltage Vn.

FIG. 2D shows the phase leg output voltage, and FIG. 2E shows the phase-to-phase output voltage, for one example of PWM operation of the inverter of FIG. 2A.

Further background can be found in the following publications, all of which are hereby incorporated by reference: Applikationshandbuch IGBT-und MOSFET-Leistungsmodule (ed. P. Martin 1998), Section 1.2.3 Qualitatives Schaltverhalten von MOSFET und IGBT beim harten Schalten (PDF); Nabae et al., "A New Neutral-Point-Clamped PWM Inverter," 17 IEEE Trans'ns on Industry App'ns 518-523 (1981); Schweizer et al., "High efficiency drive system with 3-level T-type inverter," Proc. 14th European Conference on Power Electronics and Applications (EPE 2011) at 1-10; Gekeler, "Soft switching three level inverter with passive snubber circuit (S3L inverter)," in Proceedings of the 2011-14th European Conference on Power Electronics and Applications (EPE 2011) 1-10; Gekeler, "Weich schaltender 3-Stufen-Pulswechselrichter mit verlustfreiem Entlastungsnetzwerk," in International ETG Congress 2011 (ETG Technical Report 130 Part B) at 264-270; U.S. Pat. No.

8,462,524; U.S. Pat. No. 6,838,925; Erdman et al., "A 2.3-MW Medium-Voltage, Three-Level Wind Energy Inverter Applying a Unique Bus Structure and 4.5-kV Si/SiC Hybrid Isolated Power Modules," http://www.nrel.gov/docs/fy15osti/63189.pdf (not prior art); the Powerex application note found at http://www.pwrx.com/pwrx/app/TLI%20Series%20 Application%20Note.pdf; and Alepuz et al., "Interfacing Renewable Energy Sources to the Utility Grid Using a Three-Level Inverter," https://www.infona.pl/resource/bwmetal. element.ieee-art-000001705641.

Multi-Level Inverters Using Sequenced Drive of Double-Base Bidirectional Bipolar Transistors The present inventor has realized that the use of BTRAN-like transistors presents surprising advantages in a multi-level implementation. The BTRAN—especially, but not only, in SiC implementations—presents a very attractive combination of high withstand voltage, low on-resistance, robustness, and fast switching, which is unique among all fully-bidirectional devices proposed to date. These provide surprising and unique advantages on a three-level inverter implemented with BTRANs. Only nine switching devices are required to provide three drive outputs from a DC supply.

BRIEF DESCRIPTION OF THE DRAWINGS

The disclosed inventions will be described with reference to the accompanying drawings, which show important sample embodiments and which are incorporated in the specification hereof by reference, wherein:

FIG. 2C shows one phase leg of the inverter of FIG. 2A.

FIG. 2D shows the phase leg output voltage, and FIG. 2E shows the phase-to-phase output voltage, for one example of PWM operation of the inverter of FIG. 2A.

Figure 4:
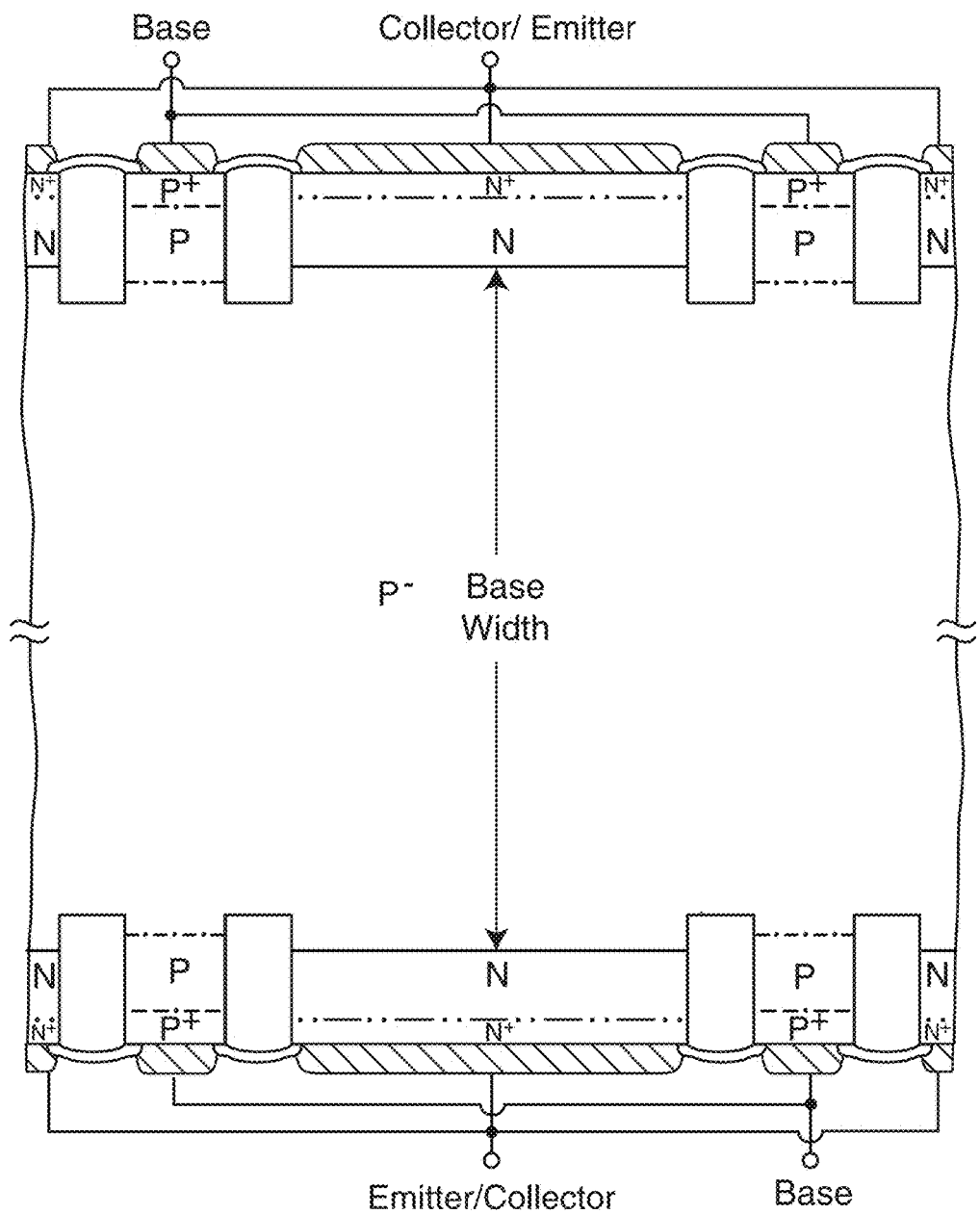

An example of a B-TRAN structure is generally illustrated in FIG. 4.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Figure 1:
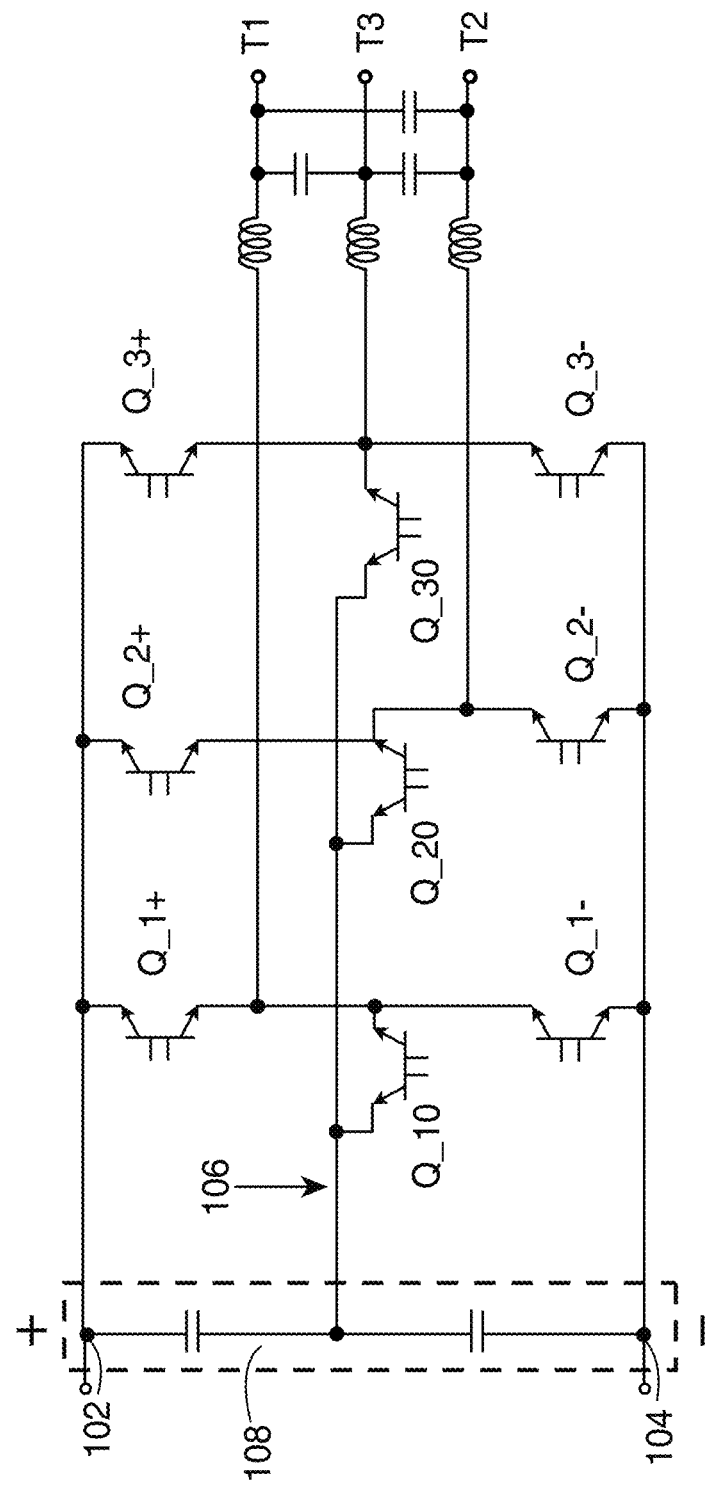
FIG. 1 schematically shows an example of a three-level-inverter which includes various disclosed innovative features.
Figure 2A:
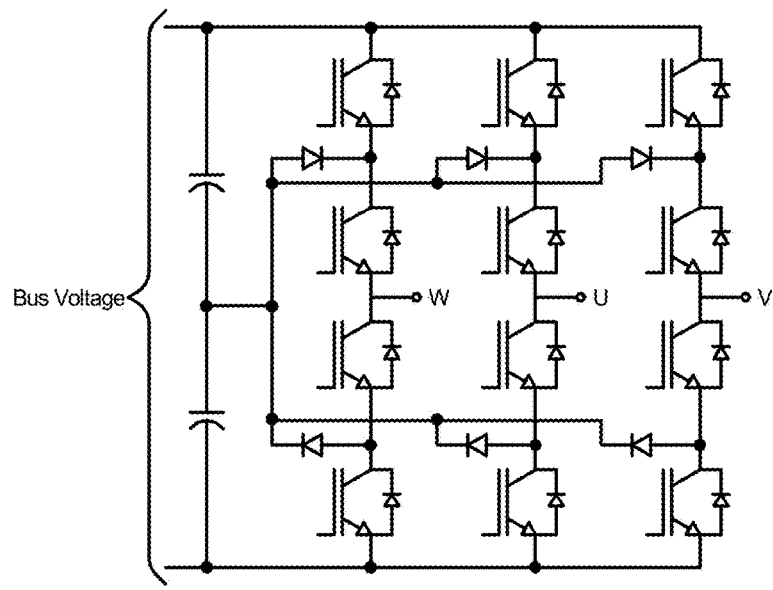
FIG. 2A shows a conventional three-phase three-level inverter using four IGBTs on each phase leg.
Figure 2B:
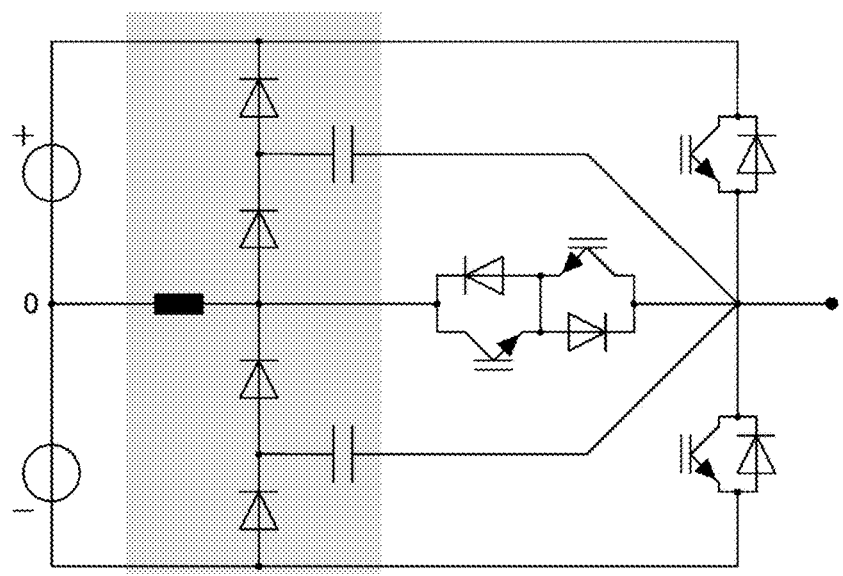
FIG. 2B shows another conventional soft-switched three-level inverter, with snubber circuit highlighted.
Figure 3A:
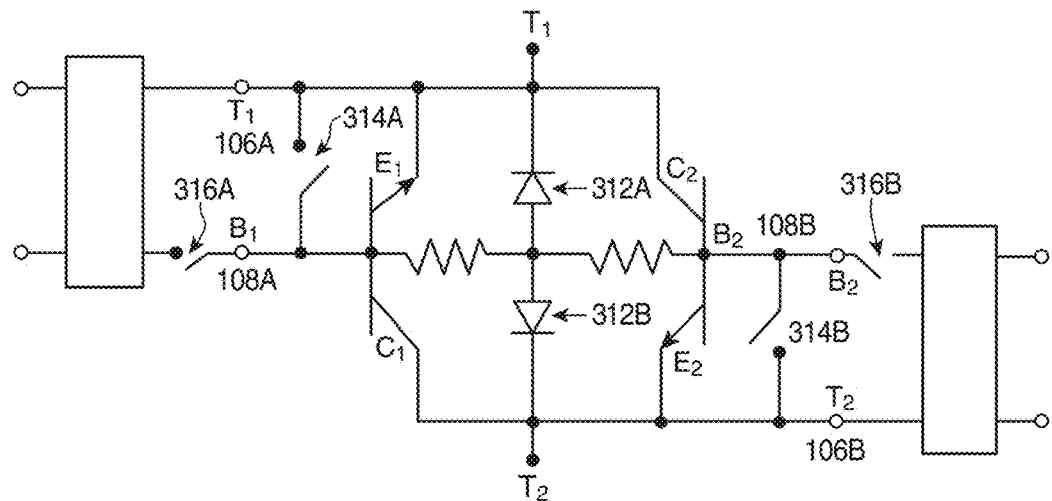
FIGS. 3A-3F show an example of operation of the BTRAN structure of FIG. 4.
Figure 3B:
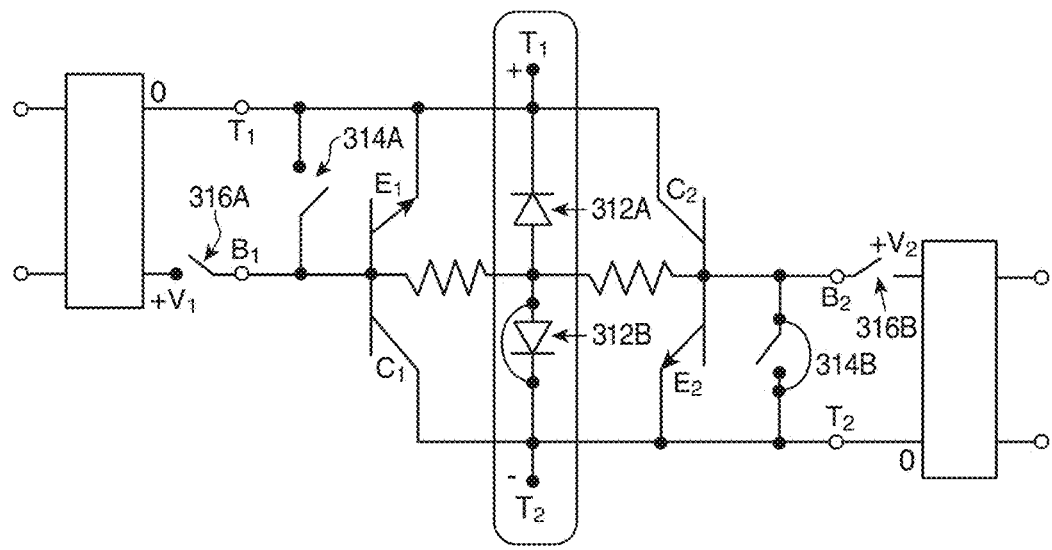
Figure 3C:
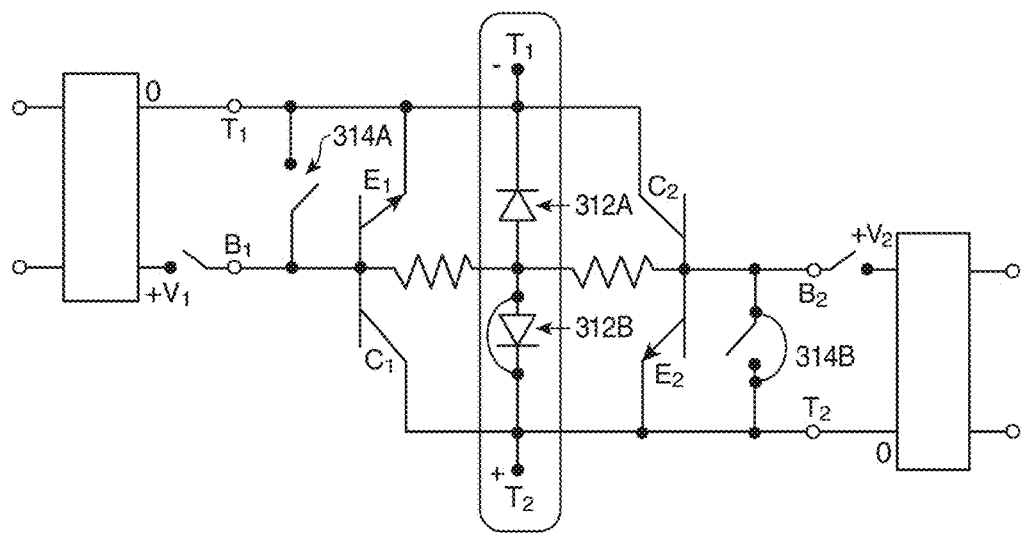
Figure 3D:
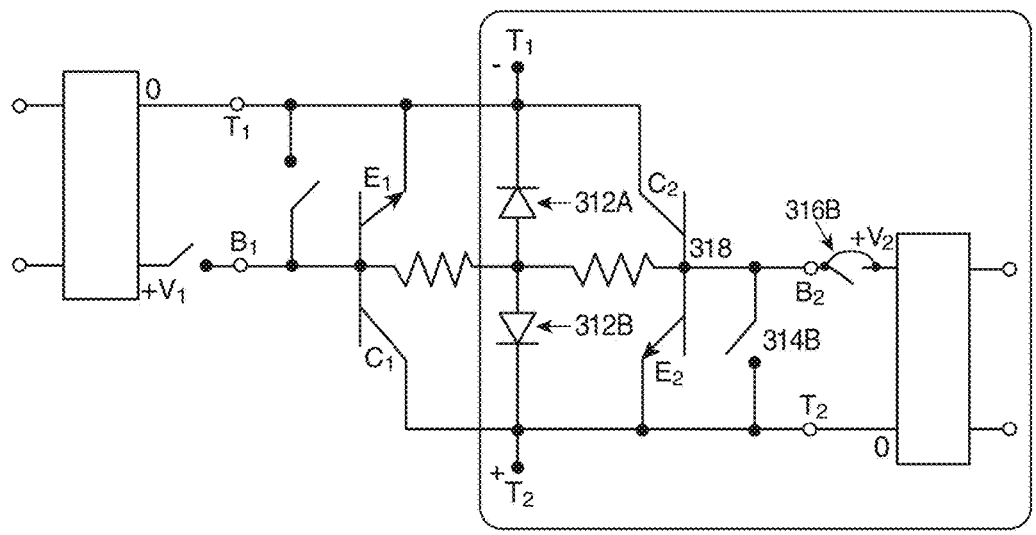
Figure 3E:
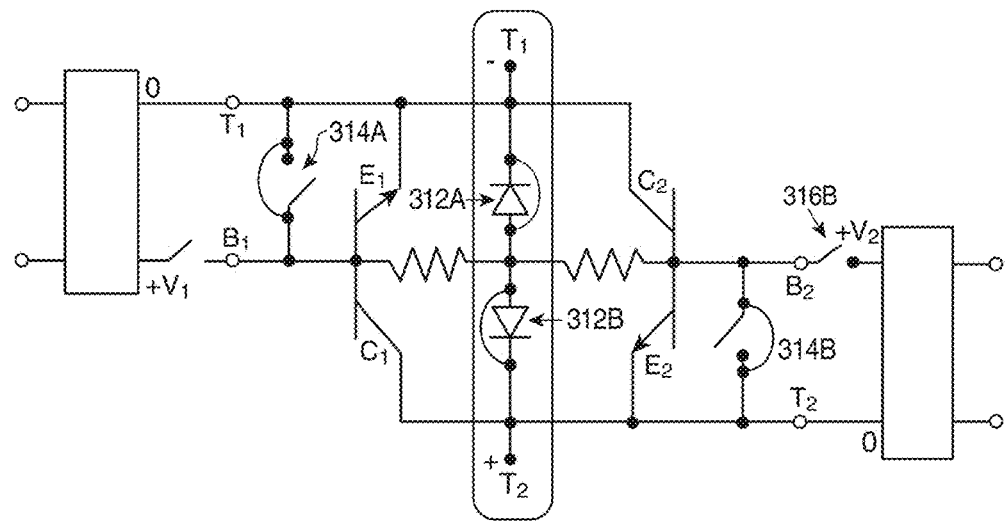
Figure 3F:
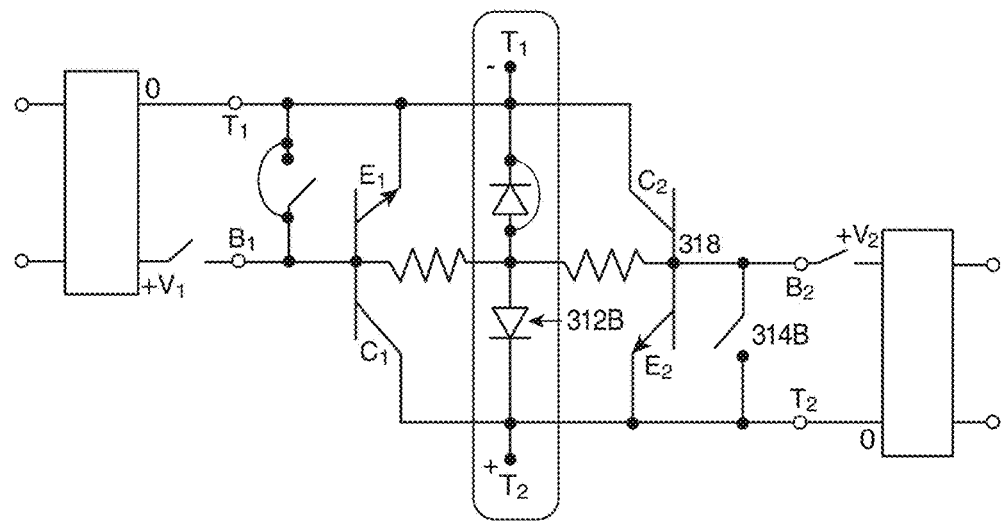

FIG. 1 schematically shows a new three-level inverter. Capacitor ladder 108 generates a neutral voltage from + and − DC input lines 102 and 104, respectively. (In some cases, such as with bipolar solar array outputs, a neutral voltage may already be present.)

The addition of neutral line 106 provides three input lines. Each of output lines T1, T2, and T3 is connected, through one respective bidirectional device (Q1+, Q10, Q1−, Q2+, Q20, Q2−, Q3+, Q30, and Q3−) to one of input lines 102, 106, and 104. Nine bidirectional devices are thus required (in this example), and that is enough.

By operating the BTRAN transistors according to conventional PWM or related methods, an AC waveform with required characteristics can be synthesized. However, the sequence used in each individual switch transition (OFF to ON or ON to OFF) is not at all conventional, in at least the following ways: 1) Before a BTRAN switch is turned fully on, it is allowed to flow current as a diode. 2) After the switch is passing current as a diode, drive is applied to the base terminal on the collector side of the device. This brings the voltage drop down to much less than a half Volt (typically a very few tenths of a Volt). 3) At turnoff, base drive is removed, but the transistor still passes current as a diode. It is only after some duration of diode conduction that the device is allowed to return to its fully blocking state. 4) Optionally, at turnoff, a brief period of reversed base drive can be performed, to reduce carrier density and thus achieve a net acceleration of turnoff.

Each of the bidirectional devices is preferably a three-layer four-terminal device. Preferably these are symmetrically-bidirectional double-base bipolar transistors, with separate base contacts on the opposite surface, as shown in FIG. 4.

Applications

The disclosed circuit works particularly well with DC inputs which include more than one voltage level. For example, many photovoltaic power arrays provide outputs of +600V and −600V.

Advantages

The disclosed innovations, in various embodiments, provide one or more of at least the following advantages. However, not all of these advantages result from every one of the innovations disclosed, and this list of advantages does not limit the various claimed inventions.

Improved efficiency in hard switching;
Higher operating voltage;
Robustness;
Lower device count.

According to some but not necessarily all embodiments, there is provided: A method of inverting power, comprising the actions of: a) providing a neutral line, and hot lines which are respectively positive and negative with reference to the neutral line; b) operating bidirectional dual-base-contact transistors to selectably connect each output line to the neutral line or to one of the hot lines, to thereby synthesize an AC waveform on each output line; wherein step b operates the transistors as diodes before full turn-on and before full turn-off, and also flows base current, at full turn-on, to lower the voltage on each said transistor.

According to some but not necessarily all embodiments, there is provided: A power inverter, comprising: a neutral line, and hot lines which are respectively positive and negative with reference to the neutral line; a plurality of output lines, and a plurality of bidirectional dual-base-contact transistors each connected between one of the output lines and one of the neutral and hot lines; and control circuitry which operates the transistors to selectably connect each output line to the neutral line or to one of the hot lines at various times, to thereby synthesize an AC waveform on each output line.

According to some but not necessarily all embodiments, there is provided: A power inverter which operates from positive, negative, and neutral lines, comprising: a plurality of output lines, and a plurality of bidirectional dual-base-contact bipolar transistors each connected between one of the output lines and one of the positive, negative, and neutral lines; control circuitry which operates the transistors to selectably connect each output line, at chosen times, to one of the positive, negative, and neutral lines, to thereby synthesize an AC waveform on each output line.

According to some but not necessarily all embodiments, there is provided: A method of inverting power from positive, negative, and neutral input lines, comprising the actions of: a) operating bidirectional dual-base-contact transistors to selectably connect each output line to one of the input lines, to thereby synthesize an AC waveform on each output line; b) wherein step a operates the transistors as diodes before full turn-on and before full turn-off, and also flows base current, at full turn-on, to lower the voltage on each said transistor.

According to some but not necessarily all embodiments, there is provided a subsystem wherein: Power is inverted using double-base-contact bidirectional bipolar transistors in a three-level-inverter topology. The transistors not only switch to synthesize a PWM approximation of the desired AC waveform, but also have transient phases of diode conduction before each full turn-on or turn-off.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Many variations of the basic BTRAN structure have been disclosed by the present inventor. See e.g. U.S. Pat. No. 9,029,909, U.S. Pat. No. 9,035,350, U.S. Pat. No. 9,054,706, U.S. Pat. No. 9,059,710, U.S. Pat. No. 9,054,707, U.S. Pat. No. 9,209,798, U.S. Pat. No. 9,190,894, U.S. Pat. No. 9,209,713, U.S. Pat. No. 9,203,400, U.S. Pat. No. 9,203,401, U.S. Pat. No. 9,231,582; US 2015-0214055 A1, US 2015-0214299 A1; U.S. Ser. No. 14/882,316, U.S. Ser. No. 14/918,440, U.S. Ser. No. 14/930,627, U.S. Ser. No. 14/935,336, U.S. Ser. No. 14/937,814, U.S. Ser. No. 14/945,097, U.S. Ser. No. 14/992,971, U.S. Ser. No. 14/957,516, U.S. Ser. No. 14/935,344, U.S. Ser. No. 14/935,349; and all priority applications of any of the above thereof. All of these applications and patents have at least some common ownership, copendency, and/or inventorship with the present application, and all of them, as well as any material directly or indirectly incorporated within them, are hereby incorporated by reference.

Optionally, the techniques described above can be used for inverting based on more than three voltage levels.

For another example, the transistors can be made of silicon or silicon carbide, or other semiconductor materials (particularly those with a relatively long minority carrier lifetime).

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

The invention claimed is:

1. A method of inverting power, comprising the actions of:
   a) providing a neutral line, and hot lines which are respectively positive and negative with reference to the neutral line; and
   b) operating bidirectional dual-base-contact transistors to selectably connect each output line to the neutral line or to one of the hot lines, to thereby synthesize an AC waveform on each output line;
   wherein step b operates the transistors as diodes before full turn-on and before full turn-off, and also flows base current, at full turn-on, to lower the voltage drop across each said transistor.

2. The method of claim 1, wherein the providing step generates the neutral line from two of the hot lines.

3. The method of claim 1, wherein step b, for each of the transistors operated thereby, flows base current, at turn-on, through a base contact which is nearest whichever side of the respective transistor is instantaneously operating as a collector, as determined by an external voltage polarity.

4. The method of claim 1, wherein each of the transistors is npn.

5. The method of claim 1, wherein each of the transistors is built in silicon carbide.

6. The method of claim 1, wherein each of the transistors is a three-layer four-terminal device.

7. A power inverter, comprising:
   a neutral line, and hot lines which are respectively positive and negative with reference to the neutral line;
   a plurality of output lines, and a plurality of bidirectional dual-base-contact transistors each connected between one of the output lines and one of the neutral and hot lines; and
   control circuitry which operates the transistors to selectably connect each output line to the neutral line or to one of the hot lines at various times, to thereby synthesize an AC waveform on each output line.

8. The inverter of claim 7, wherein the neutral line is generated from two of the hot lines.

9. The inverter of claim 7, wherein each of the transistors is npn.

10. The inverter of claim 7, wherein each of the transistors is built in silicon carbide.

11. The inverter of claim 7, wherein each of the transistors is a three-layer four-terminal device.

12. A power inverter which operates from positive, negative, and neutral lines, comprising:
   a plurality of output lines, and a plurality of bidirectional dual-base-contact bipolar transistors each connected between one of the output lines and one of the positive, negative, and neutral lines; and
   control circuitry which operates the transistors to selectably connect each output line, at chosen times, to one of the positive, negative, and neutral lines, to thereby synthesize an AC waveform on each output line.

13. The inverter of claim 12, wherein the neutral line is generated by averaging the positive and negative lines.

14. The inverter of claim 12, wherein each of the transistors is npn.

15. The inverter of claim 12, wherein each of the transistors is built in silicon carbide.

16. The inverter of claim 12, wherein each of the transistors is a three-layer four-terminal device.

* * * * *